US007083991B2

(12) United States Patent
Gaynor

(10) Patent No.: US 7,083,991 B2
(45) Date of Patent: Aug. 1, 2006

(54) METHOD OF IN-SITU TREATMENT OF LOW-K FILMS WITH A SILYLATING AGENT AFTER EXPOSURE TO OXIDIZING ENVIRONMENTS

(75) Inventor: Justin F. Gaynor, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/065,624

(22) Filed: Feb. 24, 2005

(65) Prior Publication Data

US 2005/0158884 A1 Jul. 21, 2005

Related U.S. Application Data

(62) Division of application No. 10/056,926, filed on Jan. 24, 2002, now abandoned.

(51) Int. Cl.
*H01L 21/00* (2006.01)
(52) U.S. Cl. .......................................... 438/4
(58) Field of Classification Search ............... 438/4, 438/FOR. 434
See application file for complete search history.

(56) References Cited

U.S. PATENT DOCUMENTS 4,882,008 A * 11/1989 Garza et al. .................. 216/48
6,114,186 A * 9/2000 Jeng et al. .................. 438/623
6,573,131 B1 * 6/2003 Yan et al. .................... 438/207

* cited by examiner

*Primary Examiner*—Michelle Estrada
(74) *Attorney, Agent, or Firm*—Beyer, Weaver & Thomas, LLP.

(57) ABSTRACT

Method and apparatus for using a silylating agent after exposure to an oxidizing environment for repairing damage to low-k dielectric films are described. Plasma photoresist removal, or ashing, may damage bonds in the low-k materials, which may lead to a significant increase in the dielectric constant of the materials. The silylating agent may be used to repair damage to the low-k films after the ashing process. Additionally, a curing process using an oxidizing environment may damage bonds in low-k materials, which may subsequently be repaired by a silylating process. The described method and apparatus may be used with low-k dielectric films including hydrophobic porous oxide films. A chamber for processing a wafer in an oxidizing environment and subsequently performing a silylation process includes an oxidizing agent inlet and a silylating agent inlet. Additionally, a chamber for performing an etch process, processing a wafer in an oxidizing environment, and subsequently performing a silylation process includes an oxidizing agent inlet, a silylating agent inlet, and an etch gas inlet. A cluster tool can include a chamber for processing a wafer in an oxidizing environment and subsequently performing a silylation process, a wafer in/out module, and may include additional processing modules such as etch modules, deposition modules for depositing low-k layers, and deposition modules for depositing cap layers.

15 Claims, 3 Drawing Sheets

METHOD OF IN-SITU TREATMENT OF LOW-K FILMS WITH A SILYLATING AGENT AFTER EXPOSURE TO OXIDIZING ENVIRONMENTS

CROSS REFERENCE TO RELATED APPLICATIONS

This is a divisional application of U.S. patent application Ser. No. 10/056,926, entitled "In-Situ Treatment of Low-K Films with a Silylating Agent After Exposure to Oxidizing Environments", filed Jan. 24, 2002 now abandoned.

FIELD OF THE INVENTION

The present invention relates to the field of integrated circuit fabrication. More specifically, the present invention relates to methods for using a silylating agent after exposure to an oxidizing environment for repairing damage to low-k dielectric films.

BACKGROUND

Increasing the speed and performance of integrated circuits ("ICs") typically calls for increasing the density of electronic components on the surface of a semiconductor wafer and increasing the speed at which the IC performs its functions. Increasing component density brings charge-carrying circuit elements closer together, thereby increasing the capacitive coupling (crosstalk) between such circuit elements and delay in the propagation of signals through the conductors. Higher capacitance is detrimental to circuit performance, especially for higher frequency operation as would typically be encountered in telecommunication applications and elsewhere.

One way of reducing capacitive coupling between proximate circuit elements is to reduce the dielectric constant ("k") of the insulator or insulating material(s) separating the coupled circuit elements by using low-k dielectric materials. The terms "low k dielectric materials" and "low-k dielectrics" are generally used to refer to dielectric materials with a dielectric constant less than that of silicon dioxide, which has a dielectric constant of about 3.9. Note that the term "low-k dielectric" applies to a material that has a low dielectric constant subsequent to processing; the material may have a higher dielectric constant upon deposition or during wafer processing. Although a number of low-k dielectric materials are available, many are incompatible with the oxidizing environments commonly encountered during IC fabrication. Oxidizing environments may be encountered during the ashing process and during curing.

"Ashing" refers to a process of removing photoresist from a substrate. In a typical patterning sequence for an etch process (for example), photoresist is applied to a layer to be etched. The photoresist is then exposed through a mask, which contains the features that define the pattern to be created. The photoresist is then developed. The development process leaves patterned photoresist on the layer and removes the rest of the resist. Next, areas of the substrate not protected by photoresist are etched. Typically, an etch process is chosen that selectively removes the material exposed by the patterned resist while causing acceptably little damage to the resist itself. Finally, the residual photoresist is removed by ashing: that is, placing the wafer in or downstream from a heated, reduced-pressure oxygen-containing or reducing plasma. Typical reducing plasmas include hydrogen, ammonia, or nitrogen/hydrogen gas combination (conventionally termed "forming gas") plasmas. The oxygen and hydrogen ions and/or radicals of the plasma are highly reactive towards carbon-carbon bonds in the resist, breaking the photoresist into volatile species such as carbon dioxide and water. The gaseous species may then be pumped out.

Ashing with an oxygen-containing plasma provides the highest ash rates, but is problematic when used in conjunction with many low-k dielectric materials. Low-k dielectrics include, for example, carbon-doped oxides, aerogels and xerogels, and mesoporous silica and silicalite films. However, these materials generally rely on a small percentage of Si—O—C or Si—C bonds to render them hydrophobic. During the ashing process, these bonds may be replaced by hydrophilic bonds, leading to absorption of water and an increase in dielectric constant. For example, hydrophobic Si—O—Si—(CH$_3$)$_3$ or Si—O—Si(CH$_3$)$_2$—O—Si bonds in the low-k dielectric material may be replaced by hydrophilic Si—OH bonds as a result of the action of the plasma during the ashing process. In a reducing plasma, they may be replaced by Si—H bonds, which can subsequently convert to Si—OH bonds in the presence of water vapor. If hydrophilic bonds form, the low-k dielectric material may absorb water from the ambient after its removal from the ash chamber, which may increase its dielectric constant to unacceptable levels. Additionally, absorbed water vapor may desorb or "outgas" during subsequent high-temperature and/or low pressure processes, interfering with the process.

One approach to the problem is to use hydrogen- or ammonia-based chemistry rather than oxygen-based chemistry for the ash plasma. Hydrogen- and ammonia-based chemistries are more selective to the photoresist and therefore do not lead to a significant increase in dielectric constant. However, the ash rates of hydrogen- and ammonia-based chemistries are typically significantly lower than the ash rate using oxygen chemistry. For example, in a commercially available ash chamber running non oxygen-based chemistries, the ash rate may be decreased to about 25% or 30% of the ash rate using oxygen chemistry. Further, even these processes have been shown to be at least slightly detrimental to most low-k films.

A second process in which an oxidizing environment may be encountered is a cure step carried out after depositing the film on the substrate. Most low-k films undergo a cure step; that is, they undergo chemical reactions after deposition on the wafer to reduce the dielectric constant, stabilize the film, remove reaction byproducts or sacrificial materials, or any combination of these. Using an oxidizing environment would often be advantageous for the cure step. The oxidizing environment may be provided by increasing the temperature in the presence of oxygen or by providing an oxygen plasma. However, many low-k films are damaged during the cure step.

Therefore, it is desirable to provide a method and apparatus for repairing damage to low-k films after exposure to an oxidizing environment. For plasma photoresist removal, it is desirable to repair the damaged low-k film before it is ever exposed to ambient pressure after ashing. Similarly, for performing a rapid cure step using an oxidizing environment after deposition of a low-k layer, it is desirable to repair the damage to the film before it is exposed to a moisture-containing atmosphere.

SUMMARY

According to an embodiment of the invention, a chamber is configured to perform a process using an oxidizing environment on a wafer with a low-k dielectric layer and to subsequently perform a silylation process. Performing the silylation process in the same chamber as the process using an oxidizing environment prevents the low-k material from being exposed to air or other moisture-containing environment before silylation repairs the low-k material by replacing some hydrophilic bonds with hydrophobic bonds. Further, it reduces the number of chambers required for processing and reduces the processing time since wafers do not need to be transferred between two separate chambers.

According to an embodiment of the invention, the chamber includes an oxidizing agent inlet and a silylating agent inlet for providing oxidizing and silylating agents to a wafer in the chamber. The chamber may include a pump out port for evacuating the chamber. In an embodiment of the invention, the chamber may be included on a cluster tool. The cluster tool may include other modules, such as a wafer in/out module and one or more additional processing chambers.

According to an embodiment of the invention, the chamber is an ash/silylation chamber for performing in-situ silylation after ashing. The chamber includes an inlet for providing a silylating agent into the chamber after the ashing process has been completed. The ash/silylation chamber further includes an inlet for providing a gas for the plasma used in the ashing process. The ash/silylation chamber includes a pump port for evacuating the chamber after the ashing processing and/or after the silylating process.

According to an embodiment of the invention an ash/silylation chamber such as that described above is provided as part of a cluster tool. The cluster tool includes an in-out module through which wafers are introduced into the cluster tool. Additionally, the cluster tool includes a transfer chamber for moving wafers among modules in the cluster tool. The transfer chamber includes a wafer handling mechanism such as a robot to transport wafers among chambers in the cluster tool. In addition to the ash/silylation chamber, the cluster tool may include additional process modules. For example, the cluster tool may include an etch chamber, or a PECVD or spin-on deposition chamber for deposition of a cap layer.

According to an embodiment of the invention, the chamber is an etch/ash/silylation chamber which further includes an etch gas inlet for performing in-situ etching, ashing, and silylation on a wafer including a low-k dielectric layer. According to an embodiment of the invention, the etch/ash/silylation chamber is part of a cluster tool which may also include a wafer in/out module, transfer chamber, and wafer handling mechanism. The cluster tool may include additional chambers; for example, a PECVD or spin-on deposition chamber for deposition of a cap layer.

In an embodiment of the invention, the chamber is an organic removal/silylation chamber, where the oxidizing environment is used to cure a low-k material. A cluster tool including such an organic removal/silylation chamber may also include a wafer in/out module for introducing one or more wafers into the cluster tool. The cluster tool may include a deposition chamber, for example a PECVD chamber or a spin-on deposition chamber, for depositing a low-k layer. Further, the cluster tool may include a PECVD chamber or a spin-on deposition chamber for depositing a cap layer. Alternately, deposition of low-k layers and cap layers may be performed in the same chamber on the cluster tool.

According to an embodiment of the invention, a method for processing a wafer with a low-k dielectric layer includes performing silylation after a low-k material is exposed to an oxidizing environment; for example, during an ashing process or during a cure process.

According to an embodiment of the invention, silylation is performed subsequent to ashing in order to repair damage to a low-k film caused by exposure to an oxidizing environment during the ashing process. The silylating agent repairs the damage to the low-k films after ashing is complete, thereby preventing a significant increase in dielectric constant due to water absorption. For example, a silylation process using the method and apparatus described here may be used to replace hydrophilic Si—OH bonds formed as a result of ashing with hydrophobic Si—O—Si—$(CH_3)_3$ or Si—O—Si$(CH_3)_2$—O—Si bonds.

The method and apparatus of embodiments of the current invention may be used with low-k dielectric films including hydrophobic porous oxide films. These films include, for example, silica aerogels, silica xerogels, silsesquioxanes including hydrisosilsesquioxane (HSQ) and methylsilsesquioxane (MSSQ), silicalite-based films, dendrite-based porous glass, and mesoporous silica. Additionally, embodiments of the invention may be used with carbon-doped oxides such as Coral™. Silicalite-based low-k dielectric films are described in commonly assigned U.S. Pat. No. 6,329,062, "Dielectric Layer Including Silicalite Crystals and Binder and Method for Producing Same for Microelectronic Circuits," which is hereby incorporated by reference in its entirety. Additionally, methods of detemplating silicalites are described in the commonly assigned U.S. patent application Ser. No. 10/046,009 entitled "Methods for Detemplating Zeolites and Silicalites for use in Integrated Circuit Manufacture," by Justin Gaynor and Patrick Van Cleemput, filed on Jan. 11, 2002, which is hereby incorporated by reference in its entirety.

An embodiment of the invention includes a method for processing a substrate, where the method includes forming a low-k dielectric layer disposed over at least a portion of the substrate. A photoresist layer is formed over at least a portion of the low-k dielectric layer, with or without intervening layers between the low-k layer and the photoresist.

The photoresist is then patterned, and portions of the photoresist removed according to the patterning. For example, the photoresist is developed, thus removing portions of the photoresist. Portions of the low-k dielectric layer or an intervening layer between the low-k dielectric layer and the photoresist layer are exposed as a result of the patterning and removal of part of the photoresist layer.

One or more processing steps are then performed on the low-k dielectric layer. For example, the low-k dielectric layer may be etched through the patterned photoresist. Note that although the etching is performed through the patterned photoresist, the etching may affect portions of the low-k dielectric layer that lie beneath the remaining photoresist. For example, in an isotropic etch a substantial amount of low-k material beneath the remaining photoresist may be removed. Also, if the photoresist is isolated from the low-k material by an intervening layer and the etch process removes the intervening layer in the resist-free areas, the low-k film will be exposed during ashing.

Subsequent to a processing step such as an etch, the remaining photoresist is removed by an ashing process, which uses a plasma to remove the remaining photoresist. An oxygen plasma allows for a high ash rate, although the plasma may be formed from a number of other constituents, including hydrogen, ammonia, or forming gas. During the ashing process, a portion of the low-k dielectric layer may be damaged. Damage to the low-k dielectric layer includes the formation of hydrophilic bonds, which may absorb water and lead to an unacceptable increase in dielectric constant.

A silylating process is subsequently performed in order to repair at least some of the damage to the low-k dielectric material. The silylating process repairs the damage by replacing hydrophilic bonds with hydrophobic bonds. For example, Si—OH bonds may be replaced by Si—O—Si—(CH$_3$)$_3$ or Si—O—Si(CH$_3$)$_2$—O—Si bonds. A number of silylating agents may be used, including hexamethyldisilazane (HMDS), dichlorodimethylsilane (DCDMS), chlorotrimethylsilane (CTMS), acetaldehyde, or combinations thereof.

BRIEF DESCRIPTION OF THE DRAWING

Use of the same or similar reference numbers in different figures indicates the same or like elements.

DETAILED DESCRIPTION

Embodiments of the current invention provide method and apparatus for using a silylating agent after exposure to an oxidizing environment in order to repair damage to low-k dielectric layers. In semiconductor processing, oxidizing environments may be encountered during the ashing process and during the cure process.

Performing the silylation process and the process using an oxidizing environment in the same chamber prevents the low-k material from absorbing water from the environment before silylation renders the low-k material hydrophobic. Further, it reduces the number of chambers required for processing and reduces the processing time since wafers do not need to be transferred between two separate chambers. As explained above, materials used for low-k dielectric layers are referred to as "low-k" even though their dielectric constant may be higher than silicon dioxide as deposited or at some later time.

Figure 1:
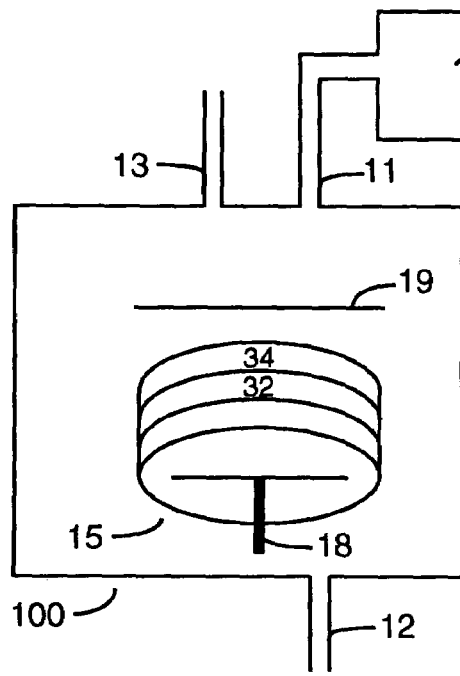
FIG. 1 shows an ash/silylation chamber according to an embodiment of the invention.

An embodiment of the invention includes a chamber for using an oxidizing environment for plasma photoresist removal and subsequently performing a silylation process, such as ash/silylation chamber 100 of FIG. 1. A wafer 15 may be positioned on a pedestal 18 inside an ash/silylation chamber 100. A low-k dielectric layer 32 is disposed on wafer 15. In some embodiments, low-k dielectric layer 32 is disposed directly on wafer 15, while in some embodiments there are one or more intervening layers between wafer 15 and low-k dielectric layer 32. Low-k dielectric layer 32 on wafer 15 has been processed; for example, a photoresist layer 34 has been applied and patterned, and portions of low-k dielectric layer 32 have been removed by an etch process. Photoresist layer 34 is disposed above low-k dielectric layer 32. It may be disposed directly on low-k dielectric layer 32, or there may be one or more intervening layers. Low-k dielectric materials that may be used for embodiments of the invention include aerogels, xerogels, porous silsesquioxanes including methylsilsesquioxane (MSSQ) and hydrisosilsesquioxane (HSQ), silicalite-based films, dendrite-based porous glass, and mesoporous silica. Additionally, embodiments of the invention may be used with carbon-doped oxides such as Coral™. After processing, the remainder of photoresist layer 34 may be removed in ash/silylation chamber 100.

Ash/silylation chamber 100 includes an inlet for providing an oxidizing agent into ash/silylation chamber 100, such as plasma gas port 11. Pedestal 18 is heated and maintained at a temperature of 30–250° C. The plasma gas is introduced at a reduced pressure; that is, below atmospheric pressure. For example, pressures in the range of 200–2000 mtorr may be used. The plasma may be an oxygen-containing plasma for increased ash rates. In other embodiments, the plasma may be reducing plasma: for example, a hydrogen-containing plasma, an ammonia-containing plasma, or a forming gas plasma. The plasma is formed by well-known methods. For example, the plasma may be formed by microwave techniques or by radiofrequency (RF) electrical field techniques in an upstream plasma generator 2. Alternately, a plasma may be produced in the vicinity of wafer 15 by providing a voltage between pedestal 18 and an upper electrode 19. Ash/silylation chamber 100 is held at a reduced pressure and oxygen is introduced either above upper electrode 19 or through holes in upper electrode 19. According to well-known methods, a plasma is generated when an appropriate electric field is maintained between pedestal 18 and upper electrode 19.

The remaining portions of photoresist layer 34 are removed in ash/silylation chamber 100 and residual byproducts are pumped out of ash/silylation chamber 100 through a pump port 12. Low-k dielectric layer 32 may be damaged due to the action of the plasma. For example, hydrophilic bonds such as Si—OH may replace hydrophobic bonds such as Si—O—Si—(CH$_3$)$_3$ or Si—O—Si(CH$_3$)$_2$—O—Si bonds. After the plasma is discontinued, a silylating agent is added through a separate silylating agent inlet such as silylating port 13 to repair damage to low-k dielectric layer 32. A separate silylating port is used in order to prevent mixing of the silylating agent with the gas used to form the plasma. The silylating agent is introduced into ash/silylation chamber 100 using an inexpensive fixed-pressure carrier gas and bubbler system. Alternately, a more expensive mass flow controller may be used. Further, since most silylating agents are toxic, embodiments of the invention use double containment of the silylating agent for safety.

In an embodiment of the invention, HMDS vapor is used as a silylating agent, which is provided into ash/silylation chamber 100 using a fixed pressure carrier gas and bubbler as follows. 100% HMDS is stored in a glass vessel in liquid form. A nitrogen line with a pressure of about 5 psi above atmospheric is immersed in the HMDS, and a flow of 500 cc/min of nitrogen carrier gas flows into the HMDS vessel. Alternately, another non-reactive gas such as helium or argon could be used. The nitrogen carrier gas bubbles through the liquid HMDS. A second line leads into ash/silylation chamber 100, which includes wafer 15. Because the pressure in the HMDS vessel will be approximately constant, a flow of about 500 cc/min flows into ash/silylation chamber 100. This flow includes nitrogen with an unknown percentage of HMDS vapor.

The pressure in ash/silylation chamber 100 is held at about 5 torr below atmospheric pressure in order to ensure that reactive byproducts are pumped out through an abatement system rather than leaking from ash/silylation chamber 100. A simple Venturi pump may be used for this purpose. The process is performed for about ten minutes at room temperature. Although the minimum process time for effective silylation may be less than ten minutes, ten minutes is sufficient. Low-k dielectric layers on wafers processed using this embodiment of the invention had dielectric constants close to their pre-ash levels and significantly reduced below post-ash levels.

Pressures of about 5 torr below atmospheric pressure may be used for silylation. Other pressures may be used. In order to change the pressure, the flow of silylating vapor may be changed, more or less carrier gas may be provided, or the vacuum line of pump port 12 may be throttled to increase or decrease the rate material is pumped out through pump port 12. After silylation is complete, ash/silylation chamber 100 may be pumped out through pump port 12.

In another embodiment, additional steps are performed after silylation. After silylation, wafer 15 is immersed in a post-etch clean bath including Ashland Chemical's proprietary NE-14 solution, which is composed mostly of water, ammonia, and hydrogen peroxide. Subsequently, a second silylation process is performed using HDMS to further repair damaged bonds.

In other embodiments, a commercial silylation process may be used. For example, HMDS vapor may be provided to a wafer held at 200 C, for a period of 20 seconds. The higher temperature used in this process enables the process time to be reduced. Alternatively, a commercial process which employs a solution of 1% HMDS in xylene may be used. The solution is spun onto the wafer; that is, dispensed while the wafer is rotating at a rate of 50–100 rpm, and allowed to dry.

An embodiment of the invention includes a chamber for etching, for processing a wafer in an oxidizing environment, and for subsequently performing a silylation process, such as etch/ash/silylation chamber 110 of FIG. 2. Etch/ash/silylation chamber 110 includes plasma gas port 11, pump port 12, and an inlet for providing an etchant to etch/ash/silylation chamber 110 such as etch gas port 14, so that etching, ashing, and silylation may all be performed in a single chamber.

An embodiment of the invention includes a chamber for using an oxidizing environment to perform a cure process and for subsequently performing a silylation process, such as an organic removal/silylation chamber 120 of FIG. 3. Organic removal/silylation chamber 120, like ash/silylation chamber 100, includes pedestal 18 for supporting and heating a wafer, plasma gas port 11, silylating port 13, and pump port 12.

Many low-k films and processes employ a sacrificial material within a matrix. For example, a material comprising a thermally labile organic group within a thermally stable inorganic matrix may be used to form a low-k dielectric layer. After the film is deposited, the sacrificial material is removed. The remaining material has a low dielectric constant. The sacrificial material may be removed by an oxidizing atmosphere. This could be a reduced-pressure environment in which an oxygen-containing plasma is generated, or a reduced-pressure environment downstream from such a plasma. It could be a high-temperature environment in which oxygen is present. The wafer is held in the oxidizing atmosphere until the low-k material cures; that is, until the material undergoes the chemical reactions to render the film thermally, chemically, and mechanically stable, and until substantially all byproducts, sacrificial moieties, and other undesired species are removed from the material. For example, one undesired species that may be removed is quaternary ammonia molecules from silicalite, as described in "Methods for Detemplating Zeolites and Silicalites for use in Integrated Circuit Manufacture," supra. After the low-k material is exposed to the oxidizing environment, silylation is performed to render the film hydrophobic.

According to an embodiment of the invention, wafer 15 includes low-k dielectric layer 32, which may be formed directly on the surface of wafer 15, or there may be intervening layers. Low-k dielectric layer 32 is formed from a material using a sacrificial material within a matrix. For example, the sacrificial material is a thermally labile organic material and the matrix is an inorganic matrix. One sacrificial material that may be used is polymeric dendrite in dendrimer glass. In order to remove the sacrificial material, oxygen or an oxygen plasma is provided through plasma gas port 11. The plasma is formed by well-known methods. For example, the plasma may be formed by microwave techniques or by radiofrequency (RF) electrical field techniques in an upstream plasma generator 2. The active species created in the plasma oxidize the organic molecules and break the large organic molecules into volatile fragments which are pumped away. Wafer 15 may also be heated by heating pedestal 18, for more effective organic removal. After removal of the organic material, silylation is performed. A silylating agent is provided through silylating port 13 as described above.

Figure 4:
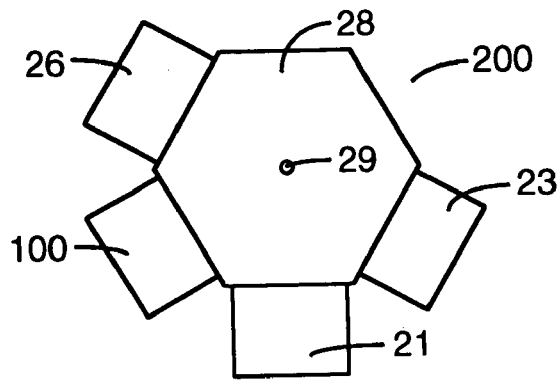
FIG. 4 shows a cluster tool including an ash/silylation chamber such as that shown in FIG. 1 according to an embodiment of the invention.

FIG. 4 shows an embodiment of a cluster tool 200. A cluster tool 200 includes a plurality of chambers, including a wafer in/out module 21 and an ash/silylation chamber such as ash/silylation chamber 100 of FIG. 1. By providing a cluster tool having an ash/silylation chamber, the wafer may be processed and ash damage repaired efficiently. Further, damage to a low-k material may be repaired before any exposure to an atmosphere which contains moisture.

A transfer chamber 28 includes a wafer handling mechanism such as a robot 29 that can move one or more wafers (not shown) in cluster tool 200. Etched wafers with patterned photoresist remaining on portions of the surface may be introduced into cluster tool 200 through wafer in/out module 21. Robot 29 moves a wafer from in/out module 21 through transfer chamber 28 to ash/silylation chamber 100. An ashing process is performed as described above, substantially removing the remaining photoresist. After the ash is complete, a silylating agent is introduced into ash/silylation chamber 100, repairing at least some of the damage caused by the ash. Subsequently, the wafer or wafers may be moved by robot 29 through transfer chamber 28 to another processing module on the cluster tool such as a first process module 23 or a second process module 26 or to wafer in/out module 21.

In an embodiment of the invention, cluster tool 200 includes wafer in/out module 21, ash/silylation chamber 100, and first process module 23. First process module 23 may be an etch module, a PECVD module for depositing a cap layer, a spin-on deposition module for depositing a cap layer, or other module. In an embodiment of the invention, first process module 23 is an etch chamber. For an embodiment where first process module 23 is an etch chamber, wafers with patterned photoresist are introduced into cluster tool 200 through wafer in/out module 21. Robot 29 moves one or more wafers from wafer in/out module 21 through transfer chamber 28 to first process module 23, where an etch is performed. After the etch is complete, robot 29 moves the wafers through transfer chamber 28 to ash/silylation chamber 100. An ashing process is performed as described above, substantially removing the remaining photoresist. After the ash is complete, a silylating agent is introduced into ash/silylation chamber 100, repairing at least some of the damage caused by the ash. Subsequently, the wafer or wafers may be moved by robot 29 through transfer chamber 28 to another processing module on the cluster tool such as second process module 26 or to wafer in/out module 21.

In an embodiment of the invention, first process module 23 of FIG. 4 may be configured to perform both an ashing process and an etching process. After the etch is performed in first process module 23, residual photoresist is removed by ashing in first process module 23. In this embodiment, after the ashing is complete, robot 29 moves the wafers through transfer chamber 28 to ash/silylation chamber 100. A silylating agent is introduced into ash/silylation chamber 100, repairing at least some of the damage caused by the ash. Subsequently, the wafer or wafers may be moved by robot 29 through transfer chamber 28 to another processing module on the cluster tool such as second process module 26 or to wafer in/out module 21.

In an embodiment of the invention, cluster tool 200 of FIG. 4 includes ash/silylation chamber 100, wafer in/out module 21, first process module 23, and second process module 26. Second process module 26 may be an etch chamber, a PECVD module for depositing a cap layer, a spin-on deposition module for depositing a cap layer, or other module. In an embodiment of the invention, first process module 23 is an etch chamber and second process module 26 is a PECVD deposition chamber for depositing a cap layer.

One or more wafers with patterned photoresist is introduced into cluster tool 200 through wafer in/out module 21. Robot 29 moves a wafer from wafer in/out module 21 through transfer chamber 28 to first process module 23, where it is etched. Robot 29 then moves the wafer through transfer chamber 28 to ash/silylation chamber 100, where ashing and then silylation are performed as described above. Robot 29 then moves the wafer through transfer chamber 28 to second process module 26, where a cap layer is deposited using PECVD methods. Subsequently, the wafer may be moved by robot 29 through transfer chamber 28 to another processing module on the cluster tool (not shown) or to wafer in/out module 21.

Figure 2:
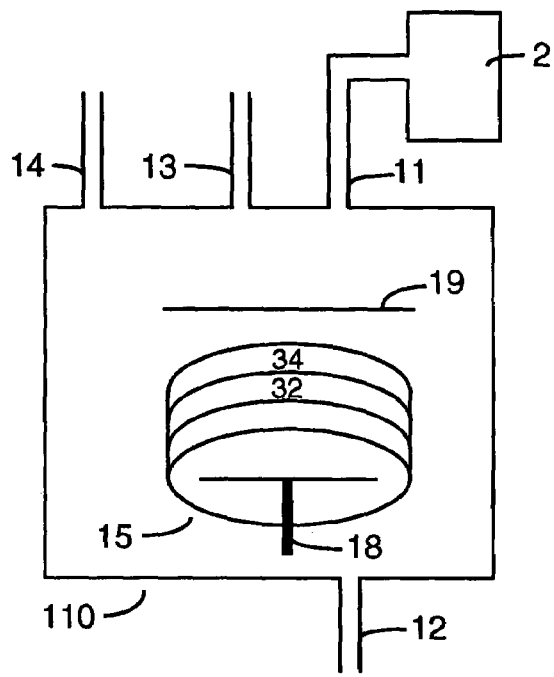
FIG. 2 shows an etch/ash/silylation chamber according to an embodiment of the invention.
Figure 5:
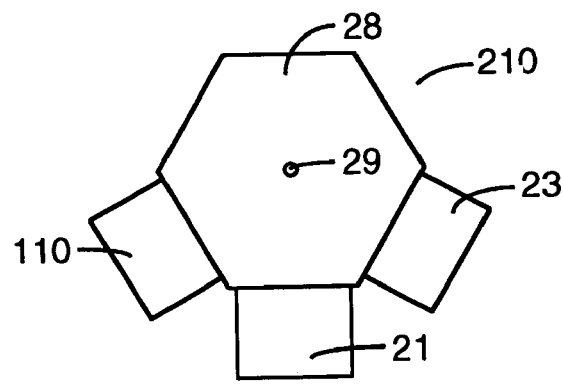
FIG. 5 shows a cluster tool including an etch/ash/silylation chamber such as that shown in FIG. 3 according to an embodiment of the invention.

FIG. 5 shows a cluster tool 210 with an etch/ash/silylation chamber such as etch/ash/silylation chamber 110 of FIG. 2, according to an embodiment of the invention. Cluster tool 230 may include additional process modules such as first process module 23. In an embodiment of the invention, cluster tool 230 includes etch/ash/silylation chamber 110 and wafer in/out module 21. One or more wafers are introduced into cluster tool 210 through wafer in/out module 21. Robot 29 moves a wafer through transfer chamber 28 to etch/ash/silylation chamber 110. The wafer is first etched. After etching, the remaining photoresist is removed by ashing. Subsequently, silylation is performed. The wafer may then be moved by robot 29 through transfer chamber 28 to another module such as first process module 23 for further processing or to wafer in/out module 21.

In an embodiment of the invention, cluster tool 210 of FIG. 5 includes etch/ash/silylation chamber 110, wafer in/out module 21, and first process module 23. First process module 23 may be a PECVD module for depositing a cap layer, a spin-on deposition module for depositing a cap layer, or other module. In an embodiment of the invention, first process module 23 is a PECVD module for depositing a cap layer. One or more wafers are introduced into cluster tool 210 through wafer in/out module 21. Robot 29 moves a wafer through transfer chamber 28 to etch/ash/silylation chamber 110. The wafer is first etched. After etching, the remaining photoresist is removed by ashing. Subsequently, silylation is performed. The wafer is then moved by robot 29 through transfer chamber 28 to first process module 23, where a cap layer is deposited using PECVD methods. Subsequently, the wafer is moved by robot 29 through transfer chamber 28 to another process module (not shown) for further processing or to wafer in/out module 21.

Figure 3:
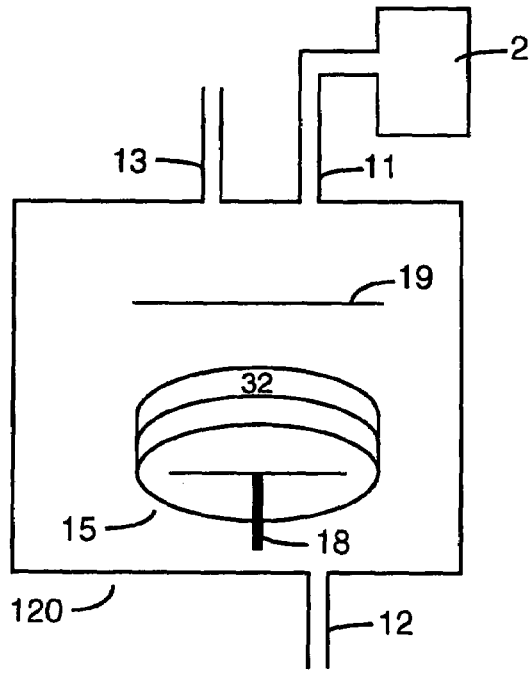
FIG. 3 shows an organic removal/silylation chamber according to an embodiment of the invention.
Figure 6:
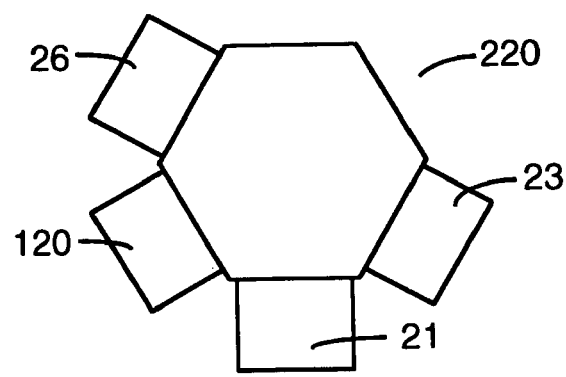
FIG. 6 shows a cluster tool including an organic removal/silylation chamber such as that shown in FIG. 2 according to an embodiment of the invention.

FIG. 6 shows a cluster tool 220 including wafer in/out module 21 and an organic removal/silylation chamber such as organic removal/silylation chamber 120 of FIG. 3, according to an embodiment of the invention. Cluster tool 240 may also include additional chambers such as a PECVD or spin-on deposition chamber for depositing a low-k layer or a cap layer. Transfer chamber 28 includes a wafer handling mechanism such as a robot 29 that can move one or more wafers (not shown) in cluster tool 220. According to an embodiment of the invention, one or more wafers with a low-k material including sacrificial organic material is introduced into cluster tool 220 through wafer in/out module 21. Robot 29 moves the wafer from wafer in/out module 21 to organic removal/silylation chamber 120. Sacrificial material is removed by an oxygen plasma in organic removal/silylation chamber 120. After the sacrificial material has been removed, a silylating agent is introduced into organic removal/silylation chamber 120, rendering the low-k film hydrophobic. Subsequently, the wafer is moved by robot 29 through transfer chamber 28 to another processing module on the cluster tool such as first process module 23 or second process module 26 for further processing, or to wafer in/out module 21.

According to an embodiment of the invention, cluster tool 220 of FIG. 6 includes wafer in/out module 21, organic removal/silylation chamber 120, and first process module 23. First process module 23 may be, for example, a PECVD deposition module or a spin-on deposition module for depositing a low-k layer or a cap layer, or other module.

In an embodiment of the invention, first process module 23 is a PECVD module. One or more wafers are introduced into cluster tool 220 through wafer in/out module 21. Robot 29 moves a wafer from wafer in/out module 21 through transfer chamber 28 to first process module 23, where a low-k layer having a sacrificial organic material is deposited by PECVD methods. Robot 29 moves the wafer from first process module 23 to organic removal/silylation chamber 120. Sacrificial material is removed by an oxygen plasma in organic removal/silylation chamber 120. After the sacrificial material has been removed, a silylating agent is introduced into organic removal/silylation chamber 120, rendering the low-k film hydrophobic. Subsequently, the wafer may be moved by robot 29 through transfer chamber 28 to another processing module on the cluster tool such as second process module 26, or to wafer in/out module 21. Alternately, robot 29 may move the wafer through transfer chamber 28 back to first process module 23, where a cap layer may be deposited by PECVD methods.

According to an embodiment of the invention, cluster tool 220 of FIG. 6 includes wafer in/out module 21, organic removal/silylation chamber 120, first process module 23, and second process module 26. First process module 23 may be a spin-on deposition chamber or PECVD deposition chamber for depositing a low-k layer or a cap layer, or other module. Similarly, second process module 26 may be a spin-on deposition chamber or PECVD chamber for depositing a low-k layer or a cap layer, or other module. In an embodiment of the invention, first process module 23 is a PECVD deposition chamber used for deposition of a low-k layer, and second process module 26 is a PECVD deposition chamber used for cap deposition.

Robot 29 moves a wafer from wafer in/out module 21 through transfer chamber 28 to first process module 23, where a low-k dielectric film is deposited using PECVD methods. After deposition, robot 29 moves the wafers through transfer chamber 28 to organic removal/silylation chamber 120. Sacrificial material is removed by an oxygen plasma in organic removal/silylation chamber 120. After the sacrificial material has been removed, a silylating agent is introduced into organic removal/silylation chamber 120, rendering the low-k film hydrophobic. If a cap layer is desired, robot 29 moves the wafer through transfer chamber 28 to second process module 26, where a cap layer is deposited using PECVD methods. Alternately, a single chamber may be used to deposit a low-k layer and a cap layer, as described above. Subsequently, the wafer or wafers may be moved by robot 29 through transfer chamber 28 to another processing module on the cluster tool (not shown) or to wafer in/out module 21.

FIGS. 7A–7G show a method of processing a substrate including a low-k dielectric layer according to an embodiment of the invention. FIGS. 7A–7G demonstrate patterning, etching, ashing, and repairing wafer 15 with low-k dielectric layer 32. Alternately, other processes may be performed on low-k dielectric layer 32. Some well-known steps in the described process have been omitted for simplicity; for example, the soft-bake and hard-bake steps.

Performing silylation after ashing prevents significant increase in the dielectric constant of the films while allowing for a high ash rate. Although the post-ash silylation step requires additional wafer processing time after ashing, it may allow a post-deposition silylation step to be omitted, leaving the total processing time substantially unchanged. Typically, after the low-k dielectric material is deposited, a silylation process is performed in order to replace hydrophilic bonds with hydrophobic bonds. This ensures that the low-k material has the optimum dielectric constant. However, when a post-ash silylation process is used, the post-deposition silylation step may be omitted.

Figure 7A:
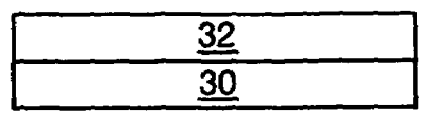
FIGS. 7A to 7G illustrate a process which may be performed on an ash/silylation chamber such as that shown in FIG. 1 by which silylation may be used to repair damage to a low-k dielectric layer caused by ashing.

Low-k dielectric layer 32 is formed on a substrate 30, as shown in FIG. 7A. Substrate 30 may be a wafer, a layer on a wafer, or other appropriate substrate. Low-k dielectric layer 32 may be patterned using lithography. Different types of lithography may be used, depending on the size of features to be patterned. For example, optical lithography may be used, using light in the visible spectrum. Alternately, electromagnetic radiation with a wavelength falling outside of the visible spectrum may also be used. For example, deep UV, extreme UV, or x-ray lithography may be used. Alternately, a charged particle beam may be used for lithography such as e-beam lithography or ion beam lithography.

Figure 7B:
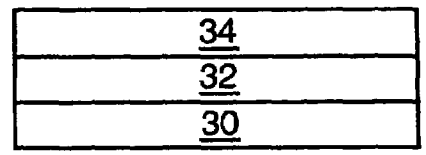

Photoresist layer 34 is formed on low-k dielectric layer 32, as shown in FIG. 7B. Alternately, there may be additional layers disposed between low-k dielectric layer 32 and photoresist layer 34. Photoresist layer 34 may be spun-on, according to well-known methods. The type of photoresist material used for photoresist layer 34 depends on the type of lithography. For example, when performing deep UV lithography, one of the deep UV photoresists provided by the Shipley Company, such as 1811, may be used.

Figure 7C:
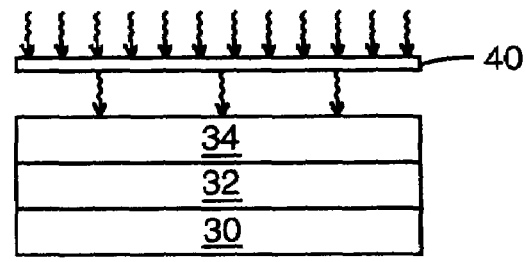
Figure 7D:
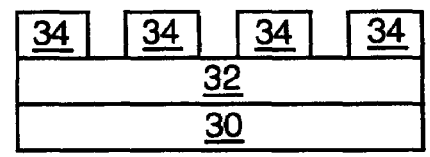

As FIG. 7C shows, for an example where optical lithography is used, photoresist layer 34 may exposed by shining light on selected portions of photoresist layer 34 through a mask 40. For a positive photoresist layer, as shown in FIG. 7C, portions of photoresist layer 34 that are exposed to light are removed by a developer, while portions of photoresist layer 34 that are not exposed to light are not removed by a developer. FIG. 7D shows the structure after photoresist layer 34 has been developed.

Figure 7E:
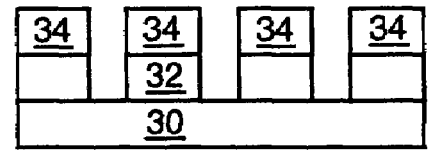

Low-k dielectric layer 32 may be etched, as shown in FIG. 7E. FIG. 7E shows a substantially anisotropic etch that is very selective of low-k dielectric layer 32 compared to photoresist layer 34.

Figure 7F:
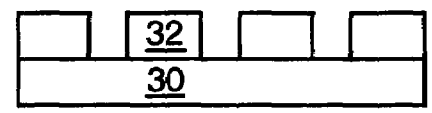

In FIG. 7F, remaining portions of photoresist layer 34 are substantially removed by an ash process, described above. As described above, the ash process may damage low-k dielectric layer 32, for example, by forming hydrophilic bonds such as Si—OH.

Figure 7G:
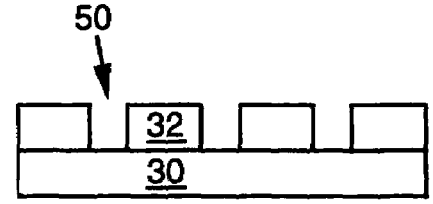

In FIG. 7G, a silylating agent 50 is provided in order to repair damaged bonds, for example to replace hydrophilic Si—OH bonds with hydrophobic Si—O—Si—$(CH_3)_3$ or Si—O—Si$(CH_3)_2$—O—Si bonds. The silylating agent used may be, for example, hexamethyldisilazane (DS), dichlorodimethylsilane (DCDMS), chlorotrimethylsilane (CTMS), acetaldehyde, or combinations thereof.

Table 1 below shows the capacitance of a silicalite film according to an embodiment of the present invention after ashing and after silylation. Ash recipe 1 included an oxygen-containing plasma, while ash recipes 2 and 3 included reducing plasmas. $C_0$ is the initial capacitance of the film, $C_a$ is the capacitance of the film after ashing, $C_{s1}$ is the film capacitance after a silylation has been performed to repair damage to the low-k film, and $C_{s2}$ is the film capacitance after an additional post-etch clean in Ashland Chemical's NE-14 and an additional silylation step using HDMS. All capacitances are in picofarads.

Table 1 illustrates that each film underwent a significant increase in capacitance (and therefore dielectric constant) as a result of the ashing process. Further, Table 1 illustrates that post-ash silylation is an effective method of decreasing dielectric constant.

TABLE 1

| Wafer | $C_0$ | Ash recipe | $C_a$ | $C_{s1}$ | $C_{s2}$ |
| --- | --- | --- | --- | --- | --- |
| 1 | 41.67 | 1 | 61.56 | 42.13 | 41.13 |
| 2 | 67.29 | 2 | 130.47 | 76.34 | 72.15 |
| 3 | 52.29 | 2 | 91.14 | 57.71 | 54.83 |
| 4 | 44.95 | 3 | 150.14 | 50.16 | 47.67 |

The results displayed in Table 1 were not obtained using an optimized process and the silylating process was not performed in-situ; better results may be obtained by optimizing the process used.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of repairing damage to a low-k dielectric layer, comprising:
   providing a low-k dielectric layer;
   providing a photoresist layer disposed above at least a portion of said low-k dielectric layer;
   removing at least a portion of said photoresist layer using an ashing process, wherein the subsequent ashing process damages the low-k dielectric layer; and subsequently performing a silylating process to repair the damage to the low-k dielectric layer.

2. The method of claim 1, wherein said ashing process comprises forming hydrophilic bonds in said low-k dielectric layer.

3. The method of claim 2, wherein said hydrophilic bonds include Si—OH.

4. The method of claim 2, wherein said silylating process comprises replacing at least some hydrophilic bonds with hydrophobic bonds.

5. The method of claim 4, wherein said hydrophobic bonds include Si—O—Si—$(CH_3)_3$ bonds.

6. The method of claim 4, wherein said hydrophobic bonds include Si—O—Si$(CH_3)_2$—O—Si bonds.

7. The method of claim 1, wherein said low-k dielectric layer includes a material chosen from the group consisting of aerogel, xerogel, silicalite, dendrite-based porous glass, mesoporous silica, and carbon-doped oxide.

8. The method of claim 1, wherein said low-k dielectric layer includes a silsesquioxane.

9. The method of claim 8, wherein said silsesquioxane is chosen form the group consisting of porous methylsilsesquioxane (MSSQ) and hydrisosilsesquioxane (HSQ).

10. The method of claim 1, wherein said ashing process comprises providing an oxygen plasma to remove said photoresist layer.

11. The method of claim 1, wherein performing said silylating process comprises providing a silylating agent.

12. The method of claim 11, wherein said silylating agent is chosen from the group consisting of hexamethyldisilazne (HMDS), dichlorodimethylsilane (DCDMS), chlorotrimethylsilane (CTMS), and acetaldehyde.

13. The method of claim 1, wherein said ashing process and said silylating process are performed in the same processing chamber.

14. The method of claim 1, further comprising:
prior to said removing, patterning said photoresist layer;
removing a portion of said photoresist layer according to said patterning; and
processing a portion of said low-k dielectric layer according to said patterning, wherein removing using said ashing process substantially removes remaining portions of said photoresist layer.

15. The method of claim 14, wherein said processing a portion of said low-k dielectric layer comprises etching.

* * * * *

UNITED STATES PATENT AND TRADEMARK OFFICE
CERTIFICATE OF CORRECTION

| | | |
|---|---|---|
| PATENT NO. | : 7,083,991 B2 | Page 1 of 1 |
| APPLICATION NO. | : 11/065624 | |
| DATED | : August 1, 2006 | |
| INVENTOR(S) | : Justin F. Gaynor | |

It is certified that error appears in the above-identified patent and that said Letters Patent is hereby corrected as shown below:

In line 2 of claim 9 (column 13, line 23) change "form" to --from--.

Signed and Sealed this

Twenty-sixth Day of June, 2007

JON W. DUDAS
*Director of the United States Patent and Trademark Office*